United States Patent [19]
Russell et al.

[11] Patent Number: 5,923,222
[45] Date of Patent: Jul. 13, 1999

[54] LOW POWER AMPLIFIER AND AN OSCILLATING CIRCUIT INCORPORATING THE AMPLIFIER

[75] Inventors: Ian Lawson Russell, Munich, Germany; Andreas Rusznyak, Chene-Bougeries, Switzerland

[73] Assignee: Motorola, Inc., Schaumburg, Ill.

[21] Appl. No.: 08/825,859

[22] Filed: Apr. 2, 1997

[51] Int. Cl.[6] .................................................. H03B 5/30
[52] U.S. Cl. ................................. 331/185; 331/DIG. 3; 331/116 R; 331/116 FE; 331/74; 331/158
[58] Field of Search .............................. 331/116 FE, 158, 331/74, 108 D, 182, 183, 185, DIG. 3, 116 R; 330/296

[56] References Cited

U.S. PATENT DOCUMENTS 4,282,496 8/1981 Heuner .............................. 331/116 FE

*Primary Examiner*—Arnold Kinkead
*Attorney, Agent, or Firm*—Robert D. Atkins

[57] ABSTRACT

An oscillating circuit includes a low power inverting amplifier (10) having an input (208) and an output (209) and having a relatively high resistance d.c. biasing path (2) associated therewith. A relatively low resistance path (3) can be switched so as to couple the amplifier input (208) and output (209) together during a bias settling phase of the circuit. A detector (50) detects the voltage at either the amplifier input (208) or the output (209) and switches the relatively low resistance path (3) so that it does not couple the input (208) and output (209) together when the detected voltage reaches a level just before a required operating voltage level.

38 Claims, 7 Drawing Sheets

LOW POWER AMPLIFIER AND AN OSCILLATING CIRCUIT INCORPORATING THE AMPLIFIER

FIELD OF THE INVENTION

This invention relates to a low power amplifier circuit, particularly, though not exclusively, a low power inverter amplifier circuit of the type used in an oscillating circuit to provide clock signals.

BACKGROUND OF THE INVENTION

In known systems, an inverter amplifier is coupled to a resonating element, for example a quartz crystal or a ceramic resonator, and a pair of load capacitors, which must be charged before the system will start to oscillate. The inverter amplifier is generally provided on an integrated circuit, for example in CMOS technology, and the resonating element is a discrete component provided off chip. The capacitors may be on or off chip. With relatively high power, the capacitors are charged to operating levels relatively quickly, so that the startup time is fairly low. However, if the operating power needs to be reduced to low levels, for example in portable, battery-operated devices, such as watches, pagers or cellular telephones, then the charging time of the capacitors is increased, in some cases to unacceptable levels.

An analysis of the effects contributing to the total start-up time of conventional push-pull inverter oscillators is known from Rusznyak, A.; "Start-Up Time of CMOS Oscillators", IEEE Trans. on Circuits and Systems, March 1987. In this known analysis it is shown that the time to charge crystal network capacitances depends partly on the value of feedback bias resistance. Most known circuits use a high value feedback resistance for d.c. bias, thus severely limiting the speed with which oscillations can start-up.

Oscillator circuits which incorporate control circuits to ensure oscillator start-up and regulate oscillation amplitude or supply current are known. One particular approach is described in Vittoz, E. A.; Quartz Oscillators for Watches, Proc. Int. Congress Chronometry, 1979. A similar approach is described in Vittoz, E. A. et al.; High-Performance Crystal Oscillator Circuits: Theory and Application, IEEE J. Solid-State Circuits, June 1988. Both these approaches are based on current source inverter amplifiers. The principle of these known circuits is to generate a negative feedback signal which is a measure of a.c. oscillation amplitude, and use it to control amplifier current, and hence also amplifier transconductance and resulting oscillation amplitude. Another particular approach is disclosed in Swiss Patent CH 640 698, awarded to Luscher, J. on Jul. 3, 1984, and is based on appropriate control of complementary current sources. The principle of this known circuit is to dynamically control variable output current at the minimum level required to drive sinusoidal circuit oscillations. All the above approaches aim to ensure that oscillations do start, and that they are subsequently sustained at minimum power drain, for all conditions of crystal resistance, MOS fabrication process, and operating environment, thus also providing maximum frequency stability. However, it is not the aim of these known circuits to reduce oscillation start-up time.

It is therefore an object of the present invention to provide an amplifier circuit for connection to a resonating element to provide clock signals, which overcomes, or at least reduces, the disadvantages of the prior art.

BRIEF SUMMARY OF THE INVENTION

Accordingly, in a first aspect the invention provides a low power amplifier circuit comprising a first node for coupling to a resonating element and to a first load capacitor and a second node for coupling to a second load capacitor, an amplifier having a pair of terminals comprising an input coupled to the first node and an output coupled to the second node and having a relatively high resistance d.c. biasing path associated therewith, a switchable relatively low resistance path for coupling the first node to the second node during a bias settling phase of the circuit, and a detector for detecting the voltage at one of the amplifier terminals and switching the relatively low resistance path so that the relatively low resistance path does not couple the first and second nodes together when the detected voltage reaches a level just before a required operating voltage level.

Preferably, the switchable relatively low resistance path includes at least one transistor having its current electrodes coupled between the first and second nodes and its control electrode coupled to the detector.

Preferably, the first and second nodes are not coupled together when the detected voltage reaches a level just below a required operating voltage level, if the voltage is rising to the required operating voltage level. Alternatively, of course, it could be when the detected voltage reaches a level just above a required operating voltage level, if the voltage is coming down to the required operating voltage level.

In a second aspect the invention provides a low power amplifier circuit comprising a first node for coupling to a resonating element and to a first load capacitor and a second node for coupling to a second load capacitor, an amplifier having a pair of terminals comprising an input coupled to the first node and an output coupled to the second node and having a relatively high resistance d.c. biasing path associated therewith, a switchable means for switching the first node so as to be coupled to a supply node at a voltage of opposite polarity to that at which the node was before the bias settling phase, and a detector for detecting the voltage at one of the amplifier terminals and switching the switchable means so that the first node is no longer coupled to the supply node when the detected voltage reaches a level just before a required operating voltage level.

Preferably, the first node is no longer coupled to the supply node when the detected voltage reaches a level just below a required operating voltage level, if the voltage is rising to the required operating voltage level. Alternatively, of course, it could be when the detected voltage reaches a level just above a required operating voltage level, if the voltage is coming down to the required operating voltage level.

In a third aspect the invention provides a low power amplifier circuit comprising a first node for coupling to a resonating element and to a first load capacitor and a second node for coupling to a second load capacitor, an amplifier having a pair of terminals comprising an input coupled to the first node and an output coupled to the second node and having a relatively high resistance d.c. biasing path associated therewith, a switchable relatively low resistance path for coupling the first node to a relatively low resistance voltage source representing a required operating voltage level during a bias settling phase of the circuit, and a detector for detecting the voltage at one of the amplifier terminals and switching the relatively low resistance path so that the relatively low resistance path does not couple the first node to the relatively low resistance voltage source when the detected voltage reaches a level just before a required operating voltage level.

Preferably, the first node is not coupled to the relatively low resistance voltage source when the detected voltage reaches a level just below a required operating voltage level, if the voltage is rising to the required operating voltage level. Alternatively, of course, it could be when the detected voltage reaches a level just above a required operating voltage level, if the voltage is coming down to the required operating voltage level.

The relatively high resistance d.c. biasing path can be either a feedback path or a path for coupling to a d.c. biasing voltage reference. The amplifying circuit can be either bipolar or MOS, preferably CMOS. Bipolar amplifiers (not shown) can use complementary transistor circuits equivalent to the CMOS circuits shown.

Preferably, the amplifier is an inverter amplifier, the first node being for coupling to one side of the resonating element and the second node being for coupling to the other side of the resonating element. Alternatively, the amplifier can be a non-inverting amplifier, the first node being for coupling to one side of the first load capacitor, the second node being for coupling to the other side of the first load capacitor. In this non-inverting case the resonating element is coupled between the first node and a supply node, and a second load capacitor can be coupled between the second node and the supply node.

In one embodiment, the first node can be coupled, before the start-up phase, to a supply node of a first polarity and the second node can be coupled, before the start-up phase, to a supply node of the same polarity as the first polarity. Alternatively, the first node can be coupled, before the start-up phase, to a supply node of a first polarity, and the second node can be coupled, before the start-up phase, to a supply node of opposite polarity to that of the first polarity.

The detector preferably comprises a comparator for comparing the voltage at the input or output of the amplifier with a reference voltage indicative of the required operating voltage and for producing an output to a latch. In one embodiment the comparator comprises an inverter stage with a pair of transistors dimensioned such that the inverter stage has a switching threshold slightly offset from the switching threshold of the amplifier, so that the inverter stage switches before the amplifier nodes reach their operating voltages. Alternatively, if the amplifier first and second nodes are not coupled to supply nodes before start-up, so that initial voltages are undefined, then the detector can comprise a window detector switch (not shown), which switches before the detected node reaches its operating voltage, from initial voltages either below or above this operating voltage.

By coupling the resonating element and the first and second load capacitors to the first and second nodes, the amplifying circuit becomes an oscillating circuit.

BRIEF DESCRIPTION OF THE DRAWINGS

Embodiments of the invention will now be more fully described, by way of example, with reference to the drawings, of which.

DETAILED DESCRIPTION

Figure 1:
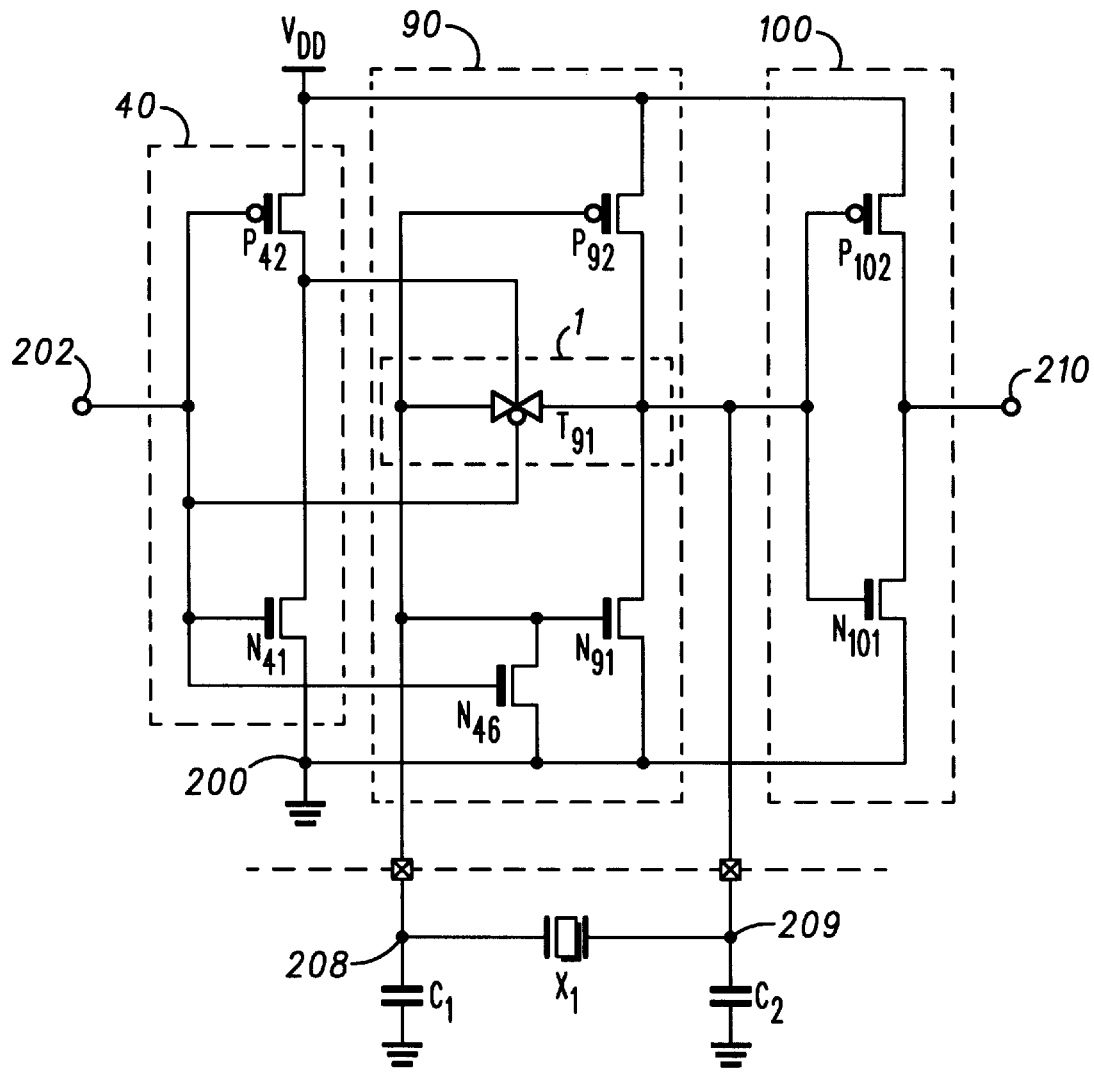
FIG. 1 shows, in schematic form, a known CMOS crystal oscillating circuit.

Thus, as shown in FIG. 1, a known CMOS crystal oscillating circuit based on a self-biased push-pull inverting amplifier essentially comprises an inverting amplifier 90, an output buffer 100, a power-down control circuit 40, an amplifier self-biasing d.c. feedback path 1, and a resonant a.c. feedback network formed by an off-chip quartz crystal or ceramic resonator X1 together with on or off-chip load capacitors C1 and C2.

Figure 2:
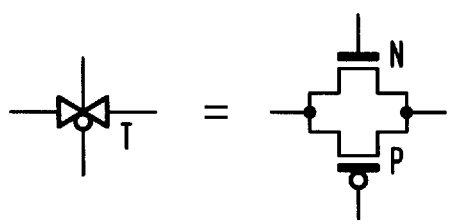
FIG. 2 shows, in schematic form, the transmission gate used in the circuit of FIG. 1.

The inverting amplifier 90 includes an NMOS transistor N91 and a PMOS transistor P92, of which the source terminals are connected to the ground (GND) and positive (VDD) supply lines 200 and 201 respectively. The drain terminals of the transistors N91 and P92 are coupled together at an amplifier output terminal 209. The gate terminals of transistors N91 and P92 are coupled together at an amplifier input terminal 208. Referring also to FIG. 2, the inverting amplifier 90 also includes the self-biasing d.c. feedback path 1 of high resistance formed by transmission gate T91, with the drain and source terminals of the MOS transistors therein connected to the amplifier input and output terminals 208 and 209 respectively, and the gate terminals of these PMOS and NMOS transistors connected to the negative enable (ENB) and positive enable (EN) nodes 202 and 203 respectively of the power-down control circuit 40 described below.

The power-down circuit 40 comprises a push-pull inverter containing complementary transistors N41 and P42, having their gate terminals driven by the negative enable signal ENB from node 202 and providing the positive enable signal EN at node 203. Together with a pull-down transistor N46, this sub-circuit allows the circuit to be disabled in a state with zero power drain and a defined level of output clock signal CLK at node 210, by setting the negative enable input ENB at node 202 to a high state.

The output buffer 100 contains another push-pull inverter formed by transistors N101 and P102, providing a buffered output of circuit oscillations at the amplifier output terminal 209, in the form of an output clock signal CLK at node 210, for use by on-chip logic circuits.

When such an oscillator circuit is initially connected to a supply voltage between the power (VDD) and ground (GND) supply lines 201 and 200 respectively, and subsequently logically enabled by switching the negative enable input signal ENB at node 202 low, the total delay before the clock output CLK at node 210 starts switching comprises two terms:

i) a d.c. bias settling time, during which the inverting amplifier 90 attains its high gain operating region, while loaded by the resonant network;

ii) an additional delay for oscillations to build up to an amplitude sufficient to generate an output clock signal CLK at node 210.

If the circuit is dimensioned for low power drain, then the major term in clock start-up delay is (i) the d.c. bias settling time, as this is the time taken to charge up the crystal network capacitances through the low power amplifier 90 and the high resistance d.c. biasing path 1. The present invention reduces this term greatly. The remaining contribution due to exponential growth of oscillation amplitude is small in comparison.

The general principle of the present invention is based on the fact that the bias settling time is determined by the large time constant associated with the high resistance d.c. biasing path 1 (eg. the transmission gate T91 containing the feedback transistors N and P above) in combination with the capacitive load of the oscillator network (eg. resonator X1 and capacitors C1 and C2). It overcomes this large time constant by additionally switching in a lower d.c. resistance biasing path during the bias settling phase, removing it again just before the amplifier reaches its operating point.

Figure 3:
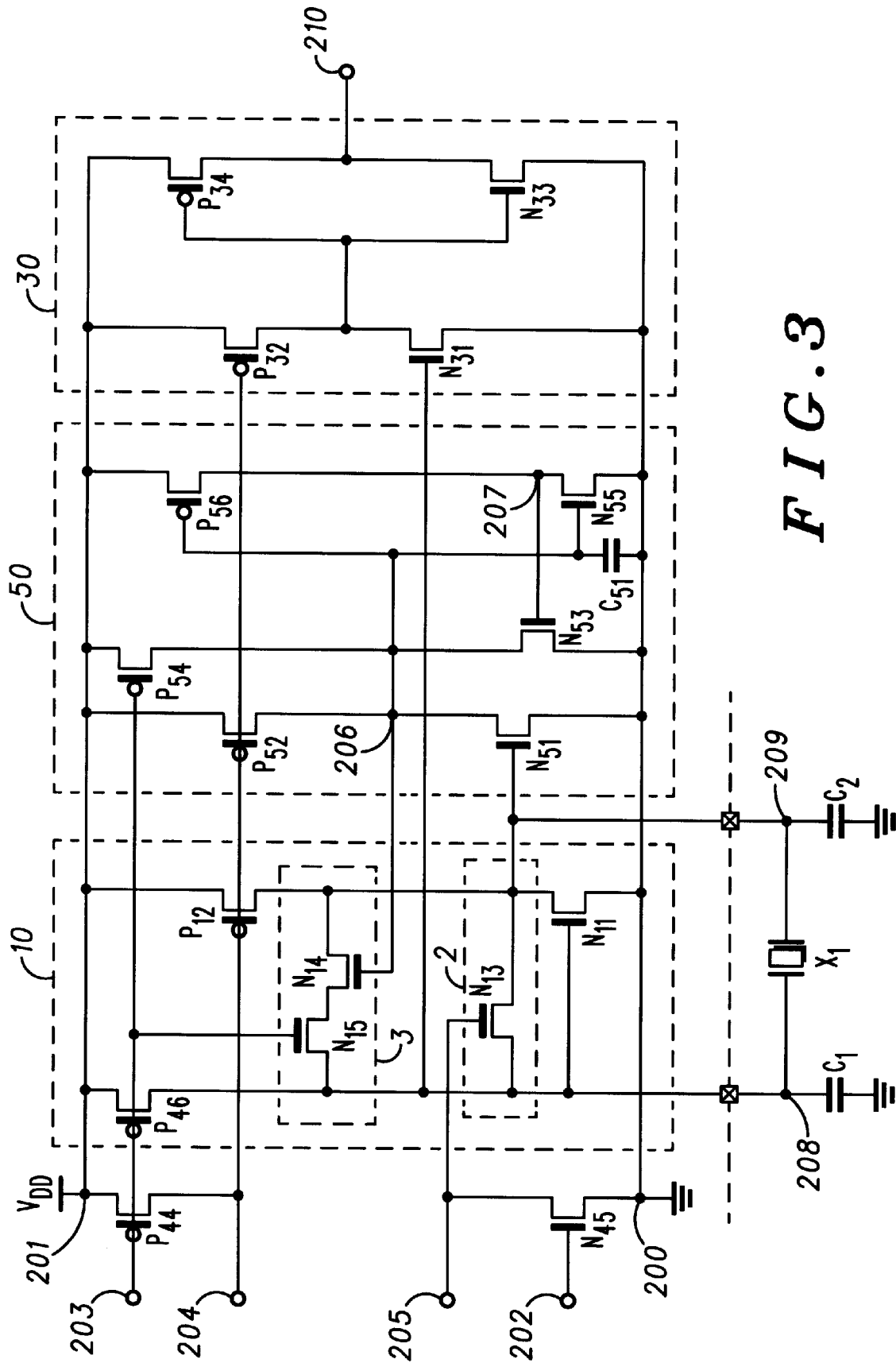
FIG. 3 shows, in schematic form, a current source inverter circuit with a switched low resistance feedback path according to a first embodiment of the invention.

Referring to FIG. 3, the first aspect of this general principle is applied to a low power oscillator circuit based on a self-biased current source inverting amplifier. This circuit essentially comprises an inverting amplifier 10, an output buffer 30, a latching threshold switch 50, an amplifier self-biasing d.c. feedback path 2, an additional fast start-up d.c. biasing path 3 (controlled by the latching threshold switch 50), and a resonant a.c. feedback network formed by an off-chip quartz crystal or ceramic resonator X1 together with on or off-chip load capacitors C1 and C2.

The current source inverting amplifier 10 includes an NMOS transistor N11 and a PMOS transistor P12, of which the source terminals are connected to the ground (GND) and positive (VDD) supply lines 201 and 200 respectively. The drain terminals of the transistors N11 and P12 are coupled together at the amplifier output terminal 209. The gate terminal of transistor N11 is connected to the amplifier input terminal 208, and the gate terminal of transistor P12 is connected to a bias voltage VPB at node 204. The inverting amplifier 10 also includes an NMOS transistor N13, with its drain and source terminals connected to the amplifier input terminal 208 and output terminal 209 respectively, and its gate terminal connected to a second bias voltage VNB at node 205, thus forming the amplifier self-biasing d.c. feedback path 2.

The latching threshold switch 50 comprises a threshold switch formed by a current source inverter and a latch formed by two cross-coupled inverter stages, together with a precharge capacitor C51. The threshold switch comprises complementary transistors N51 and P52, with the current source bias signal at the gate terminal of transistor P52 connected to the VPB signal at node 204, the input signal at the gate terminal of transistor N51 connected to the amplifier output terminal 209, and the output signal connected to a latch set terminal 206. The latch is formed by two cross-coupled inverter stages, comprising complementary transistor pairs N53 and P54, and N55 and P56 respectively. The latch is preset with set terminal 206 at a high level by setting the enable signal EN at node 203 low initially, and is later reset with the latch set terminal 206 low by the inverting threshold switch, when the voltage at the amplifier output terminal 209 exceeds the threshold voltage of the NMOS transistor N51.

The output buffer 30 comprises a current source inverter, comprising complementary transistors N31 and P32, with the current source bias terminal at the gate terminal of transistor P32 connected to the VPB signal at node 204, and the input terminal at the gate terminal of transistor N31 connected to the amplifier input terminal 208, followed by a push-pull inverter (comprising complementary transistors N33 and P34).

The low resistance biasing path 3 comprises the serial combination of transistors N14 and N15, having their gate terminals controlled by a set signal (S) of the latching threshold switch at latch set terminal 206, and the positive enable signal (EN) at node 203, respectively.

The switched pull-up transistors P44, P46 and pull-down transistor N45, in conjunction with a power-down circuit 40 such as previously described with reference to FIG. 1, allow the circuit to be disabled in a state with zero power drain and a defined level of output clock signal CLK at node 210, by setting the negative enable input ENB at node 202 to a high state.

By means of the low resistance biasing path 3, controlled by the latching threshold switch 50, the logically triggered power-up delay (ie. operating point settling time) of the amplifier 10 is greatly reduced. This is achieved by assisting the d.c. feedback path 2 containing the high resistance transistor N13 with the additional parallel switched path 3 containing the low resistance transistors N14 and N15 during the start-up phase. This removes the large time constant associated with the large resistance of the feedback transistor N13 and the capacitive load of the external oscillator network during its initial d.c. charge-up. Inverter power-up delay is typically reduced to less than 1% of the time required to start the unassisted inverter from the most favourable initial conditions. This reduces greatly the major term in the start-up time of this low power oscillator.

The inverter 10 is released from an initial power-off condition with circuit nodes at the following levels: negative enable signal ENB at node 202 is high, positive enable signal EN at node 203 is low, set signal S at set terminal 206 is high, input signal IN at input terminal 208 is at supply voltage VDD, and output signal OUT at output terminal 209 is at ground voltage GND, thereby minimising the subsequent inverter bias settling time. In the initial power-off condition transistor N14 is on, but transistor N15 is off, thus preventing contention between the amplifier input terminal 208 and output terminal 209.

When the circuit is powered up by switching negative enable (ENB) node 202 low and hence positive enable (EN) node 203 high, transistor N14 is already on and transistor N15 is now also switched on. Transistor P12 sources current into both the transistor Nil and the capacitive load. between the amplifier input terminal 208 and output terminal 209; additionally charge is balanced between capacitors C1 and C2 through transistors N14 and N15; both contributions cause the voltage at the output terminal 209 to rise and the voltage at the input terminal 208 to fall, so that both terminals converge towards the steady state operating point of the inverter. During this process the transistor N14 is operated according to the following sequence:

i) transistor N14 is held on initially by the precharged latch, as the voltage at the amplifier output terminal 209 rises;

ii) transistor N14 is switched off by the threshold switch just before the voltage at the amplifier output terminal 209 reaches its final operating point voltage; circuit oscillations now start to build up;

iii) transistor N14 is held off by the latch as long as the circuit remains powered up, irrespective of subsequent oscillation and hence varying voltage at the amplifier output terminal 209.

Ratioed transistor dimensions ensure that the low resistance feedback path will always be switched off just before the inverter bias levels reach the steady state operating point, thereby releasing amplifier action and allowing crystal controlled oscillation to start.

Figure 4:
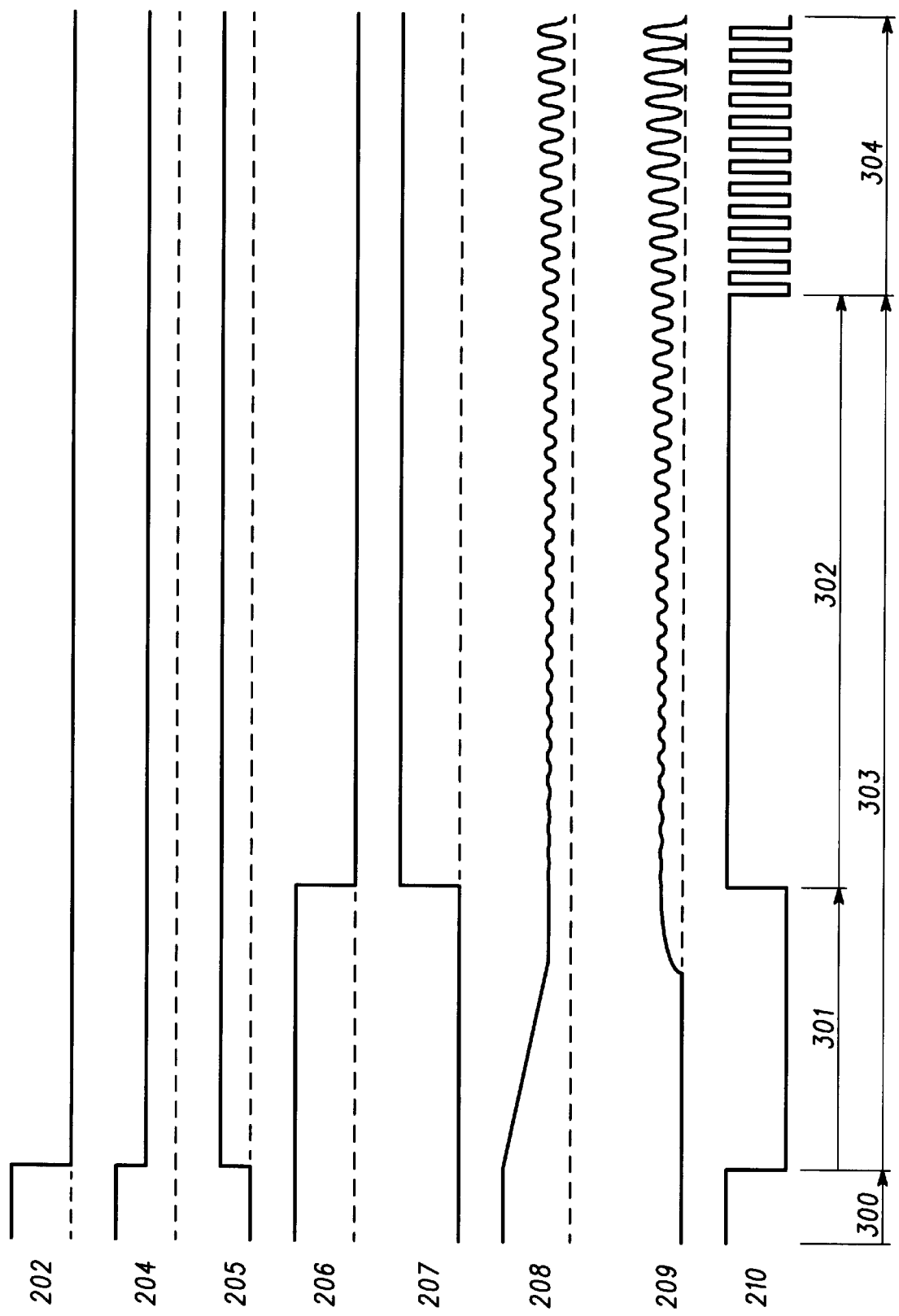
FIG. 4 shows the voltage waveforms during a start-up phase of the circuit of FIG. 3.

In FIG. 4 the voltage waveforms at major circuit nodes of FIG. 3 during start-up are shown, including the effects of the additional precharge and start-up circuitry described above. Thus, in the initial disable phase 300, the negative enable signal ENB at node 202 is high, disabling the circuit with zero current drain and defined clock output CLK at node 210. The bias reference voltages VPB at node 204 and VNB at node 205 have high and low initial disabled states respectively. The latch set terminal 206 and set complement terminal 207 are preset high and low respectively, thus switching the transistor N14 on in preparation for start-up. The amplifier input and output terminals 208 and 209 are preset high and low respectively. The clock output CLK at node 210 is preset high in the disabled state.

At the start of the bias settling phase 301, the circuit is powered-up by switching the negative enable signal ENB at node 202 low, after which the bias reference voltages VPB and VNB at nodes 204 and 205 move to their operating levels. Initially the latch terminals 206 and 207 remain in their power-off states. The voltage at the amplifier input terminal 208 falls towards the steady state operating level, and subsequently the voltage at the amplifier output terminal 209 rises towards the steady state operating level; both processes being accelerated by the switched low resistance biasing path 3. The clock output signal CLK switches high during this phase.

The oscillation amplitude build-up phase 802 starts when the latching threshold switch 50 switches the low resistance biasing path 3 off via transistor N14, just before the voltage at the amplifier output terminal 209 reaches its final operating level. Subsequently the amplitude of oscillations at the amplifier input and output terminals 208 and 209 increases, at a rate determined by the characteristics of the amplifier and crystal network.

The clock output phase 304 starts when the amplitude at the amplifier input terminal 208, after amplification through the output buffer 30, is sufficient to generate a rail to rail clock output (CLK) at node 210.

Together the phases 301 and 302 constitute the total start-up time 303. Thus, the additional circuits 3 and 50 reduce the bias settling part 301 of the total start-up time 303 from being the predominant term to being only a minor contribution, hence reducing total start-up time greatly.

Figure 5:
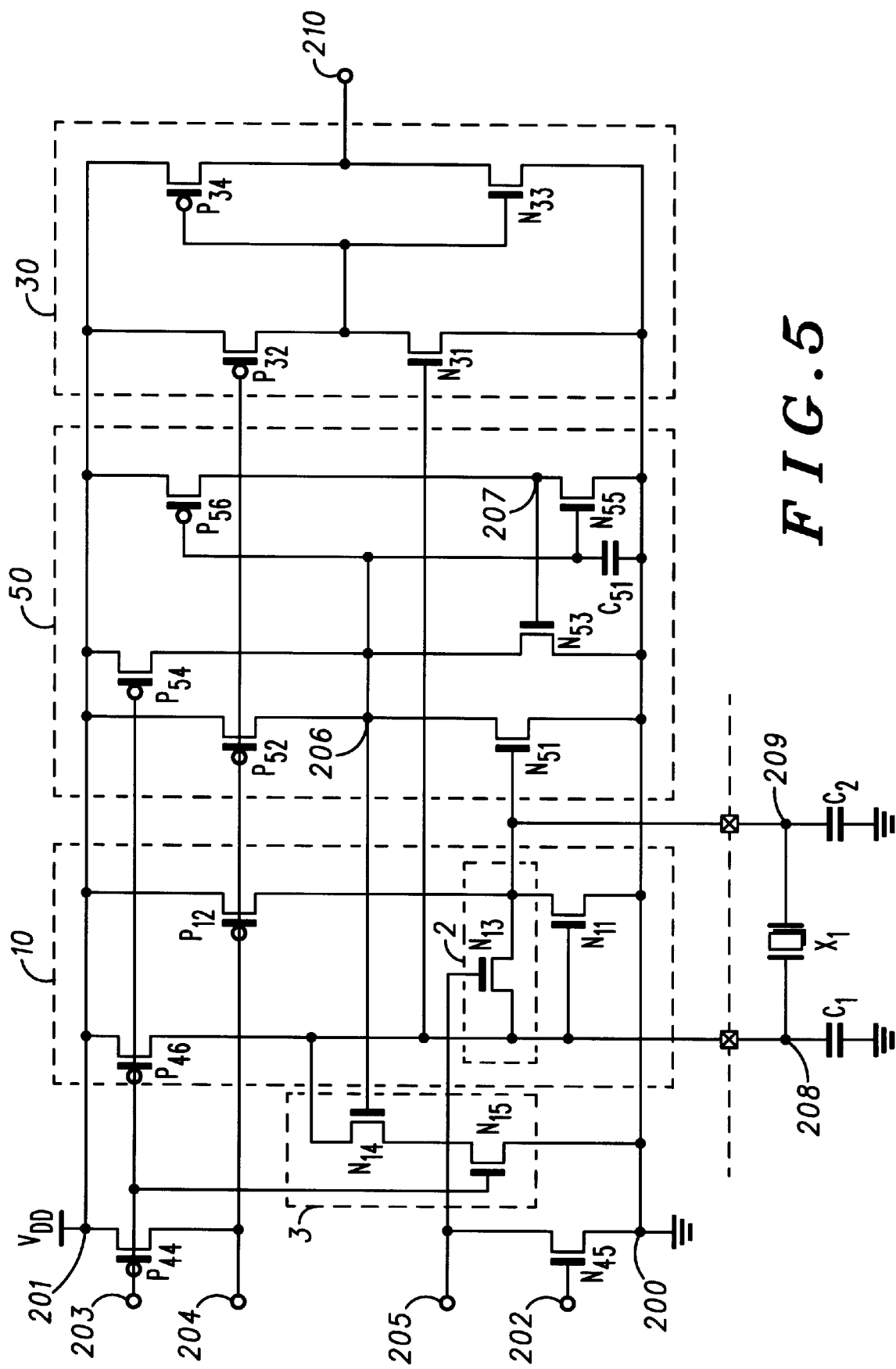
FIG. 5 shows, in schematic form, a current source inverter circuit with switched low resistance path from an input to a power rail according to a second embodiment of the invention.

Referring to FIG. 5, the second aspect of this general principle is applied to a current source oscillator circuit, by now inserting the low resistance biasing path 3 between the amplifier input terminal 208 and a power rail during the biasing phase 301; in this case the ground line 200 is used since the input terminal 208 was previously precharged to the VDD positive voltage supply line 201. The switching of the low resistance biasing path 3 is again controlled by the latching threshold switch 50.

Circuit operation is otherwise similar to the previous description of the first aspect which referred to FIG. 3 and FIG. 4. Once again the latching threshold switch 50 senses when the amplifier output terminal 209 has almost reached its operating point, and then switches the low resistance biasing path 3 out of circuit.

Figure 6:
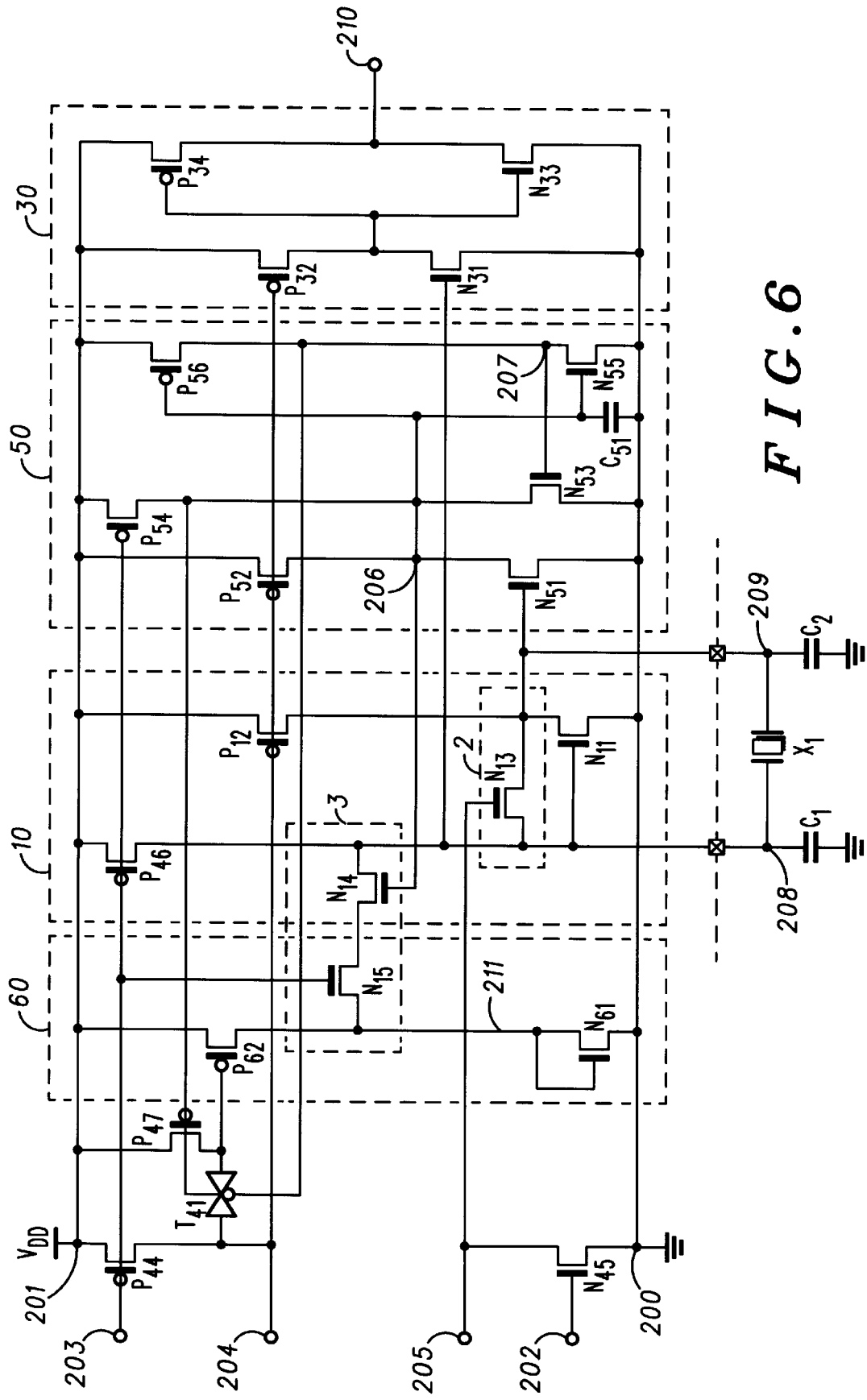
FIG. 6 shows, in schematic form, a current source inverter circuit with a switched low resistance path from an input to a bias replica circuit according to a third embodiment of the invention.

Referring to FIG. 6, the third aspect of this general principle is applied to a current source oscillator circuit, by driving the amplifier input terminal 208 from a low d.c. resistance voltage source 60 during the biasing phase 301. The voltage source 60 generates a reference voltage VOP1 at its output node 211, having the same voltage as the final amplifier operating point level, ie. the voltage source 60 is a bias replica circuit which tracks the final d.c. operating voltage at the input and output terminals 208 and 209 of the inverting amplifier 10, but operates at greater bias current and hence has lower source resistance. This voltage source 60 is provided by complementary transistors N61 and P62, having significantly larger channel widths than the transistors N11 and P12 in the amplifier 10, but with the same ratio of PMOS to NMOS channel widths W as transistors N11 and P12 in the amplifier 10, ie. $W_{62}:W_{61}=W_{12}:W_{11}$. All four transistors have the same channel length. The voltage source 60 is connected to the amplifier input terminal 208 via the low resistance biasing path 3. The switching of the low resistance biasing path 3 is again controlled by the latching threshold switch 50.

The switched pull-up transistors P44, P46, P47, pull-down transistor N45, and transmission gate T41, in conjunction with a power-down circuit 40 such as previously described with reference to FIG. 1, allow the circuit to be disabled in a state with zero power drain and a defined level of output clock signal CLK at node 210, by setting the negative enable input ENB at node 202 to a high state.

Circuit operation is otherwise similar to the previous description of the first aspect which referred to FIG. 3 and FIG. 4. Once again the latching threshold switch 50 senses when the amplifier output terminal 209 has almost reached its operating point, and then switches the low resistance biasing path 3 out of circuit.

Figure 7:
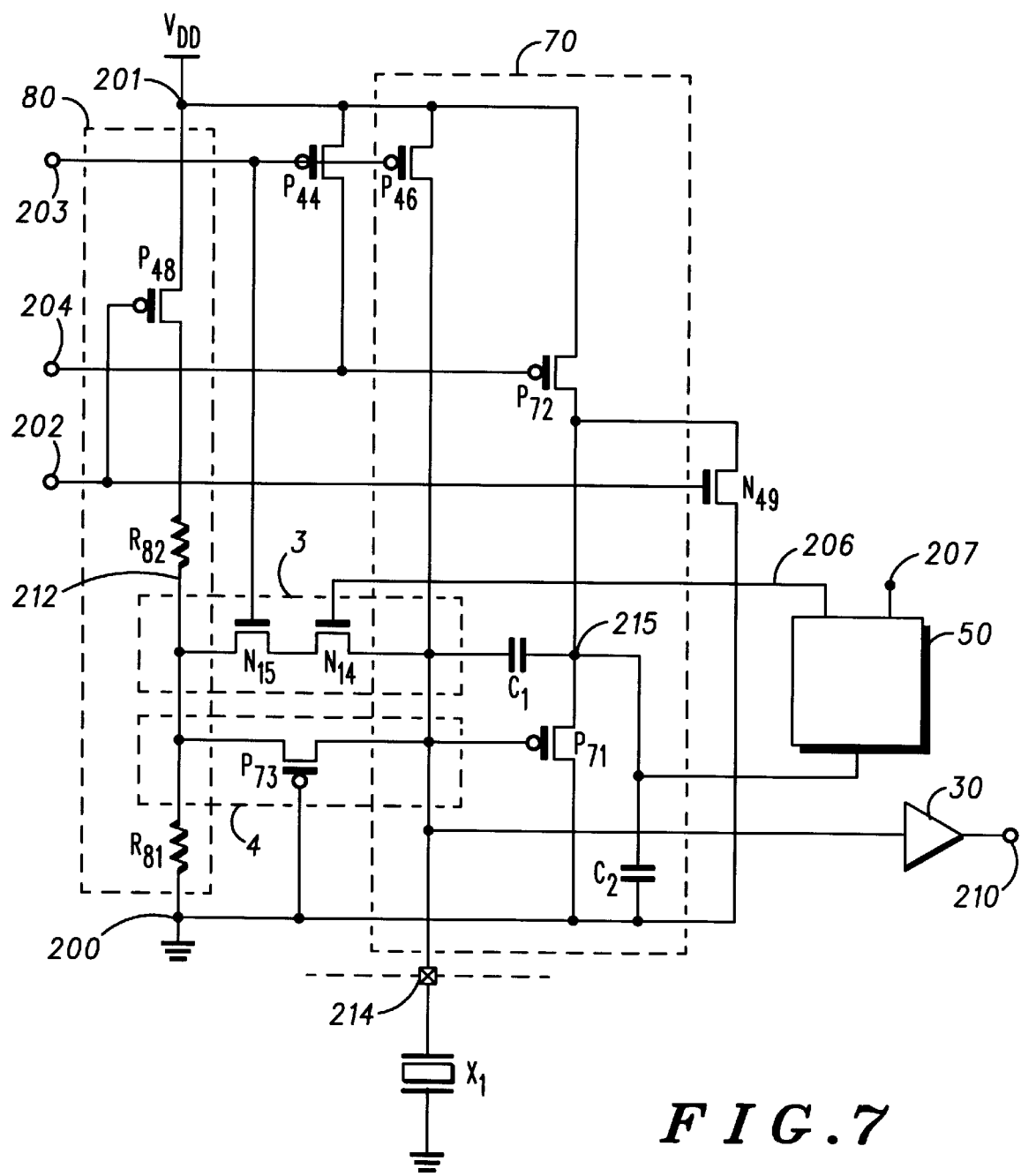
FIG. 7 shows, in schematic form, a one-pin oscillator circuit incorporating a switched low resistance path similar to the one shown in FIG. 3.

Referring to FIG. 7, the principle is applied in another way equivalent to the previous illustration of the first aspect in FIG. 3, now for the case of an oscillator using a non-inverting source follower amplifier 70 (containing the PMOS transistors P71 and P72), as sometimes used in 1 pin oscillator circuits, when capacitors C1 and C2 are on-chip. In this case the quartz crystal or ceramic resonator X1 is connected between the amplifier input terminal 214 and the ground supply line 200. The capacitor C1 is connected between the input terminal 214 and output terminal 215, and the capacitor C2 is connected between the output terminal 215 and the ground supply line 200. In this case, biasing by the high resistance d.c. feedback path 2 (as used in the previous circuits) is often replaced by a high resistance d.c. path 4 (which may contain a PMOS transistor P73) connecting the amplifier input terminal 214 to a bias reference voltage VOP2 at node 212, derived for example from a voltage divider 80 formed by resistors R81 and R82. Thus, the bias settling phase 301 can once again be greatly reduced, for example by now inserting the switched low resistance biasing path 3 in parallel with the high resistance biasing path 4. The switching of the low resistance biasing path 3 is again controlled by the latching threshold switch 50.

The switched pull-up transistors P44, P46, P48, and pull-down transistor N49, in conjunction with a power-down circuit 40 such as previously described with reference to FIG. 1, allow the circuit to be disabled in a state with zero power drain and a defined level of output clock signal CLK at node 210, by setting the negative enable input signal ENB at node 202 to a high state.

Circuit operation is otherwise similar to the previous description of the first aspect which referred to FIG. 3 and FIG. 4. Once again the latching threshold switch 50 senses when the amplifier output terminal 215 has almost reached its operating point, and then switches the low resistance biasing path 3 out of circuit.

Figure 8:
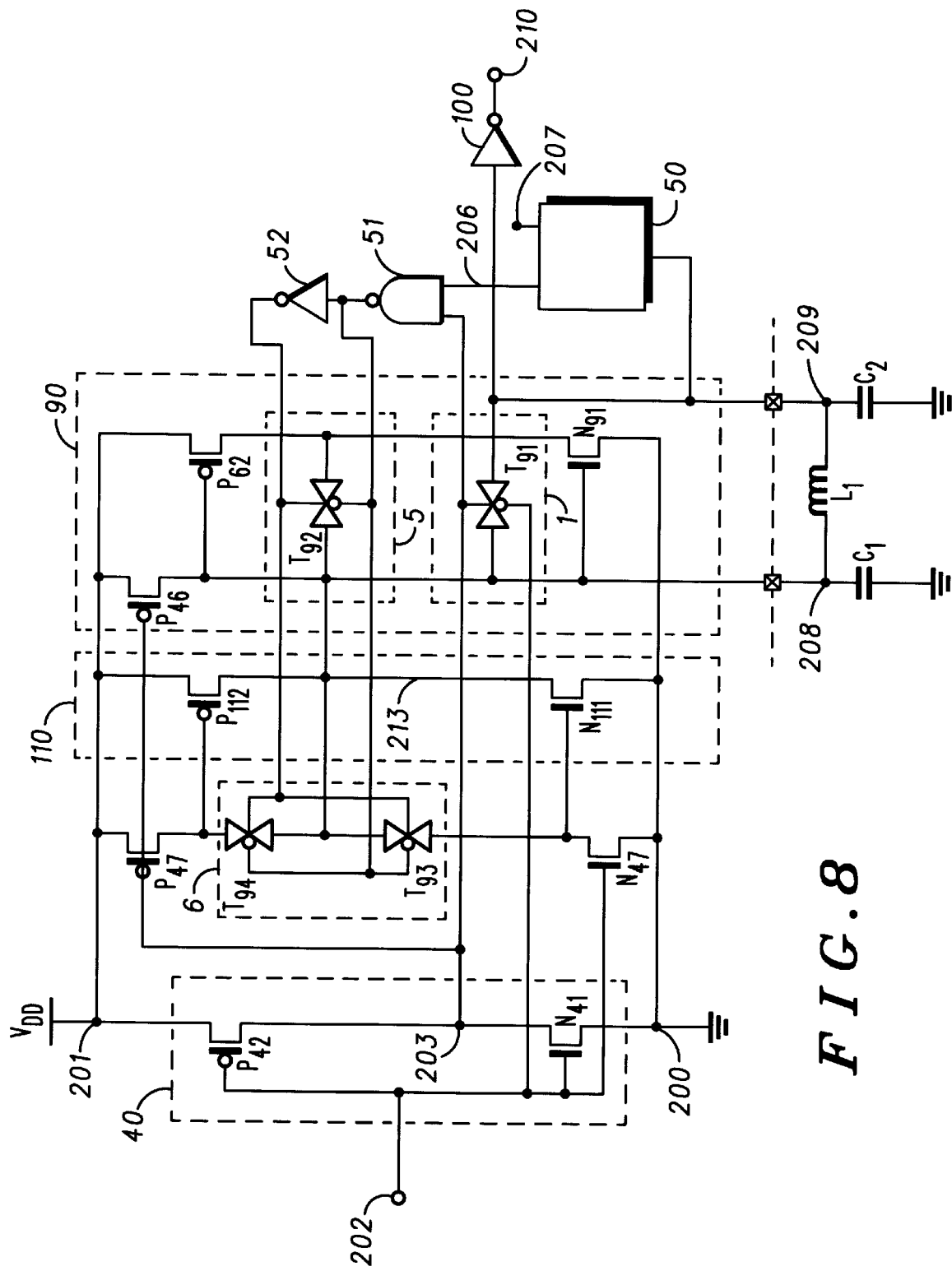
FIG. 8 shows, in schematic form, an oscillator circuit utilising the principles of the embodiments of the invention shown in FIGS. 3 and 6.

Referring to FIG. 8, the principle is applied in a combination of the first and third aspects, to the more generally used push-pull inverting amplifier 90, with another type of resonant circuit, eg. a network containing inductor L1 connected between the amplifier input and output terminals 208 and 209, and load capacitors C1 and C2 connected between these terminals and the ground supply line 200. One effective combination of biasing paths is shown, whereby biasing via the high resistance d.c. feedback path 1 is assisted during start-up by a switched low resistance feedback path 5 (containing a transmission gate T92), and also additionally by a switched connection 6 (containing transmission gates T93, T94) to a low resistance bias replica circuit 110 (similar to that described with reference to FIG. 6) providing a bias reference voltage VOP3 at node 213. The bias replica circuit 110 is provided by the complementary transistors N111 and P112, having significantly larger channel widths W than the transistors N91 and P92 in the amplifier 90, but with the same ratio of PMOS to NMOS channel widths W as N91 and P92 in the amplifier 90, ie. $W_{112}:W_{111}=W_{92}:W_{91}$. All four transistors have the same channel length. The switching of the low resistance biasing paths 5 and 6 are again controlled by the latching threshold switch 50.

In this circuit the equivalent logical AND control function of the low resistance biasing path 3 in previous circuits (provided by the series combination of the transistors N14 and N15) is replaced by an AND gate 51, with one input connected to the latch set terminal 206 of the latching threshold switch 50, and the other input connected to the positive enable (EN) node 203. The output of the NAND gate 51 is connected to the input of the inverter 52, thereby providing complementary control signals for the transmission gates T92, T93, T94 contained in the low resistance biasing paths 5 and 6.

The witched pull-up transistors P46, P47, pull-down transistor N47, and transmission gates T93, T94, in conjunction with a power-down circuit 40 such as previously described with reference to FIG. 1, allow the circuit to be disabled in a state with zero power drain and a defined level of output clock signal CLK at node 210, by setting the negative enable input ENB at node 202 to a high state.

Circuit operation is otherwise similar to the previous description of the first aspect which referred to FIG. 3 and FIG. 4. Once again the latching threshold switch 50 senses when the amplifier output terminal 209 has almost reached its operating point, and then switches the low resistance biasing paths 5 and 6 out of circuit.

It will be appreciated that although several particular embodiments of the invention have been described in detail, various other modifications and improvements can be made by a person skilled in the art without departing from the scope of the present invention.

We claim:

1. A low power amplifier circuit comprising a first node for coupling to a resonating element and to a first load capacitor and a second node for coupling to a second load capacitor, an amplifier having a pair of terminals comprising an input coupled to the first node and an output coupled to the second node and having a relatively high resistance d.c. biasing path associated therewith, a switchable relatively low resistance path for coupling the first node to the second node during a bias settling phase of the circuit, and a detector for detecting a voltage at one of the amplifier terminals and switching the relatively low resistance path so that the relatively low resistance path does not couple the first and second nodes together when the detected voltage reaches a level just before a required operating voltage level.

2. A low power amplifier circuit according to claim 1, wherein the switchable relatively low resistance path includes at least one transistor having its current electrode coupled between the first and second nodes and its control electrode coupled to the detector.

3. A low power amplifier circuit according to claim 1, wherein the first and second nodes are not coupled together when the detected voltage reaches a level just below a required operating voltage level, if the voltage is rising to the required operating voltage level.

4. A low power amplifier circuit according to claim 1, wherein the first and second nodes are not coupled together when the detected voltage reaches a level just above a required operating voltage level, if the voltage is coming down to the required operating voltage level.

5. A low power amplifier circuit according to claim 1 wherein the relatively high resistance d.c. biasing path is a feedback path.

6. A low power amplifier circuit according to claim 1, wherein the relatively high resistance d.c. biasing path is a path for coupling to a d.c. biasing voltage reference.

7. A low power amplifier circuit according to claim 1, wherein the amplifier is an inverter amplifier, the first node being for coupling to one side of the resonating element and the second node being for coupling to the other side of the resonating element.

8. A low power amplifier circuit according to claim 1, wherein the amplifier is a non-inverting amplifier, the first node being for coupling to one side of the first load capacitor and the second node being for coupling to the other side of the first load capacitor.

9. A low power amplifier circuit according to claim 8, wherein the resonating element is coupled between the first node and a supply node, and the second load capacitor is coupled between the second node and the supply node.

10. A low power amplifier circuit according to claim 1, wherein the first node is coupled, before the bias settling phase, to a supply node of a first polarity and the second node is coupled, before the bias settling phase, to a supply node of the same polarity as the first polarity.

11. A low power amplifier circuit according to claim 1, wherein the first node is coupled, before the bias settling phase, to a supply node of a first polarity, and the second node is coupled, before the bias settling phase, to a supply node of opposite polarity to that of the first polarity.

12. A low power amplifier circuit according to claim 1, wherein the detector comprises a comparator for comparing the voltage at one of the amplifier terminals with a reference voltage indicative of the required operating voltage and for producing an output to a latch.

13. A low power amplifier circuit according to claim 12, wherein the comparator comprises an inverter stage having a pair of transistors dimensioned such that the inverter stage has a switching threshold slightly offset from a switching threshold of the amplifier, so that the inverter stage switches before the amplifier terminal at which the voltage is detected reaches its operating voltage.

14. A low power amplifier circuit according to claim 1, wherein the first and second nodes are not coupled to supply nodes before the bias settling phase so that initial voltages are undefined, and the detector comprises a window detector switch, which switches before the amplifier terminal at which the voltage is detected reaches it operating voltage, from initial voltages either below or above this operating voltage.

15. A low power amplifier circuit according claim 1, wherein the amplifier terminal at which the voltage is detected is the output of the amplifier.

16. A low power amplifier circuit comprising a first node for coupling to a resonating clement and to a first load capacitor and a second node for coupling to a second load capacitor, an amplifier having a pair of terminals comprising an input coupled to the first node and an output coupled to the second node and having a relatively high resistance d.c. biasing path associated therewith, a switchable means for switching the first node so as to be coupled to a supply node at a voltage of opposite polarity to that at which the node was before a bias settling phase, and a detector for detecting a voltage at one of the amplifier terminals and switching the switchable means so that the first node is no longer coupled to the supply node when the detected voltage reaches a level just before a required operating voltage level.

17. A low power amplifier circuit according to claim 16, wherein the first node is no longer coupled to the supply node when the detected voltage reaches a level just below a required operating voltage level, if the voltage is rising to the required operating voltage level.

18. A low power amplifier circuit according to claim 16, wherein the first node is no longer coupled to the supply node when the detected voltage reaches a level just above a required operating voltage level, if the voltage is coming down to the required operating voltage level.

19. A low power amplifier circuit according to claim 16 wherein the relatively high resistance d.c. biasing path is a feedback path.

20. A low power amplifier circuit according to claim 16, wherein the relatively high resistance d.c. biasing path is a path for coupling to a d.c. biasing voltage reference.

21. A low power amplifier circuit according to claim 16, wherein the first node is coupled, before the bias settling phase, to a supply node of a first polarity and the second node is coupled, before the bias settling phase, to a supply node of the same polarity as the first polarity.

22. A low power amplifier circuit according to claim 16, wherein the first node is coupled, before the bias settling phase, to a supply node of a first polarity, and the second node is coupled, before the bias settling phase, to a supply node of opposite polarity to that of the first polarity.

23. A low power amplifier circuit according to claim 16, wherein the detector comprises a comparator for comparing the voltage at one of the amplifier terminals with a reference voltage indicative of the required operating voltage and for producing an output to a latch.

24. A low power amplifier circuit according to claim 23, wherein the comparator comprises an inverter stage having a pair of transistors dimensioned such that the inverter stage has a switching threshold slightly offset from a switching threshold of the amplifier, so that the inverter stage switches before the amplifier terminal at which the voltage is detected reach es its operating voltage.

25. A low power amplifier circuit comprising a first node for coupling to a resonating element and to a first load capacitor and a second node for coupling to a second load capacitor, an amplifier having a pair of terminals comprising an input coupled to the first node and an output coupled to the second node and having a relatively high resistance d.c. biasing path associated therewith, a switchable relatively low resistance path for coupling the first node to a relatively low resistance voltage source representing a required operating voltage level during a bias settling phase of the circuit, and a detector for detecting a voltage at one of the amplifier terminals and switching the relatively low resistance path so that the relatively low resistance path does not couple the first node to the relatively low resistance voltage source when the detected voltage reaches a level just before a required operating voltage level.

26. A low power amplifier circuit according to claim 25, wherein the first node is not coupled to the relatively low resistance voltage source when the detected voltage reaches a level just below a required operating voltage level, if the voltage is rising to the required operating voltage level.

27. A low power amplifier circuit according to claim 25, wherein the first node is not coupled to the relatively low resistance voltage source when the detected voltage reaches a level just above a required operating voltage level, if the voltage is coming down to the required operating voltage level.

28. A low power amplifier circuit according to claim 25, wherein the relatively high resistance d.c. biasing path is a feedback path.

29. A low power amplifier circuit according to claim 25, wherein the relatively high resistance d.c. biasing path is a path for coupling to a d.c. biasing voltage reference.

30. A low power amplifier circuit according to claim 25, wherein the amplifier is an inverter amplifier, the first node being for coupling to one side of the resonating element and the second node being for coupling to the other side of the resonating element.

31. A low power amplifier circuit according to claim 25, wherein the amplifier is a non-inverting amplifier, the first node being for coupling to one side of the first load capacitor and the second node being for coupling to the other side of the first load capacitor.

32. A low power amplifier circuit according to claim 31, wherein the resonating element is coupled between the first node and a supply node, and the second load capacitor is coupled between the second node and the supply node.

33. A low power amplifier circuit according to claim 25, wherein the first node is coupled, before the bias settling phase, to a supply node of a first polarity and the second node is coupled, before the bias settling phase, to a supply node of the same polarity as the first polarity.

34. A low power amplifier circuit according to claim 25, wherein the first node is coupled, before the bias settling phase, to a supply node of a first polarity, and the second node is coupled, before the bias settling phase, to a supply node of opposite polarity to that of the first polarity.

35. A low power amplifier circuit according to claim 25, wherein the detector comprises a comparator for comparing the voltage at one of the amplifier terminals with a reference voltage indicative of the required operating voltage and for producing an output to a latch.

36. A low power amplifier circuit according to claim 35, wherein the comparator comprises an inverter stage having a pair of transistors dimensioned such that the inverter stage has a switching threshold slightly offset from a switching threshold of the amplifier, so that the inverter stage switches before the amplifier terminal at which the voltage is detected reaches its operating voltage.

37. A low power amplifier circuit according to claim 25 wherein the first and second nodes are not coupled to supply nodes before the bias settling phase so that initial voltages are undefined, and the detector comprises a window detector switch, which switches before the amplifier terminal at which the voltage is detected reaches it operating voltage, from initial voltages either below or above this operating voltage.

38. An oscillating circuit incorporating a low power amplifier comprising a first node for coupling to a resonating element and to a first load capacitor and a second node for coupling to a second load capacitor, an amplifier having a pair of terminals comprising an input coupled to the first node and an output coupled to the second node and having a relatively high resistance d.c. biasing path associated therewith, a switchable relatively low resistance path for coupling the first node to the second node during a bias settling phase of the circuit, and a detector for detecting a voltage at one of the amplifier terminals and switching the relatively low resistance path so that the relatively low resistance path does not couple the first and second nodes together when the detected voltage reaches a level just before a required operating voltage level.

* * * * *